(12) United States Patent
Rothermel et al.

(10) Patent No.: US 6,384,341 B1
(45) Date of Patent: May 7, 2002

(54) DIFFERENTIAL CONNECTOR FOOTPRINT FOR A MULTI-LAYER CIRCUIT BOARD

(75) Inventors: Brent R. Rothermel, Harrisburg; Chad W. Morgan, Mechanicsburg; Alex M. Sharf; David W. Helster, both of Harrisburg, all of PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/845,907

(22) Filed: Apr. 30, 2001

(51) Int. Cl.[7] .................................................. H05K 1/03
(52) U.S. Cl. .................... 174/255; 174/250; 174/261; 174/262; 174/266; 361/792; 361/793; 361/794; 361/795
(58) Field of Search ................................ 174/255, 250, 174/262, 266, 261, 260; 361/791, 792, 793, 794, 795, 780

(56) References Cited

U.S. PATENT DOCUMENTS

| 4,494,172 A | * | 1/1985 | Leary et al. | 361/780 |
| 4,498,122 A | * | 2/1985 | Rainal | 361/794 |
| 4,791,722 A | * | 12/1988 | Miller, Jr. | 29/850 |
| 5,159,536 A | | 10/1992 | Silverio | 361/400 |
| 5,191,174 A | * | 3/1993 | Chang et al. | 174/266 |
| 5,293,502 A | * | 3/1994 | Kimura et al. | 174/250 |
| 5,397,861 A | | 3/1995 | Urquhart, II | 174/250 |
| 5,538,433 A | * | 7/1996 | Arisaka | 439/70 |
| 5,574,630 A | * | 11/1996 | Kresge et al. | 361/792 |
| 5,847,936 A | * | 12/1998 | Forehand et al. | 361/794 |
| 6,271,478 B1 | * | 8/2001 | Horiuchi et al. | 174/255 |

* cited by examiner

Primary Examiner—Jeffrey Gaffin
Assistant Examiner—I B Patel

(57) ABSTRACT

A multi-layer circuit board is provided that simultaneously optimizes impedance and interference within the multi-layer circuit board and a controlled impedance connector to which it is attached. The multi-layer circuit board includes at least one signal circuit layer, a plurality of signal contacts grouped in differential pairs and located on one signal circuit layer, and a plurality of ground contacts located on at least one ground circuit layer. The signal contacts are arranged in a pattern, or matrix, in which differential pairs of signal contacts are staggered in rows of the pattern. In accordance with an embodiment of the present invention, each differential pair of the multi-layer circuit board is more tightly coupled to a ground contact than to any other signal contact. The multi-layer circuit board, also includes a plurality of signal trace segments arranged in pairs. Both signal trace segments of a pair are equal in length and connect to signal contacts via linear routing channels.

40 Claims, 4 Drawing Sheets

DIFFERENTIAL CONNECTOR FOOTPRINT FOR A MULTI-LAYER CIRCUIT BOARD

BACKGROUND OF THE INVENTION

The embodiments of the present invention generally relate to multi-layer circuit boards having circuit layers, and more particularly, to a multi-layer circuit board having circuit layers that include unique differential connector patterns, or footprints.

In the past, controlled impedance connectors have been proposed that are used as board-to-board connectors. Certain board-to-board connectors attach to printed circuit boards through multiple circuit layers. The circuit layers may be either signal circuit layers or ground circuit layers. Typically, the circuit layers are positioned such that signal and ground circuit layers alternate. That is, two signal circuit layers are separated by one ground circuit layer. The signal layers may be sandwiched between the ground layers in order to control cross-talk, signal to noise ratio and impedance within the circuit board. Maintaining a uniform impedance throughout the signal path is preferable for proper signal transmission.

Previously, fluctuations in impedance exhibited by a connector did not degrade performance by an appreciable amount, in part because signal/data transmission rates were relatively low (e.g., less than 1 GHz or 1 Gbits per second). However, newer systems have been proposed that are able to transmit data signals at speeds approaching and exceeding 2 GHz or Gbits per second. Because the speed of data transmission systems continues to increase, even small impedance fluctuations may pose significant problems, such as signal loss, within each connector and the system.

Heretofore, high speed data systems have relied on signal resolution to compensate for signal discontinuities. Signal resolution regards voltage transitions within the system. For example, a voltage switch from 0 V to 1 V occurs in a finite amount of time referred to as the edge rate. The edge rate is a function of the distance over which (or time required for) the voltage changes. That is, if voltage is switched from 0 V to 1 V over a conductive path, the voltage switch does not occur instantaneously over the conductive path. Instead, a certain amount of resolution time is required over a conductive path to switch states. For example, if voltage changes over a conductive distance from point A to point B, the voltage change travels along the distance from point A to point B. That is, when the voltage first changes to 1 V, the voltage at point A may be 1 V, but the voltage at point B may still be 0 V. As the voltage change travels from point A to point B, the voltage changes over the distance from point A to point B. However, the voltage at point B changes to 1 V when the voltage change arrives at point B. The progression of the change of voltage from 0 V to 1 V over the distance defined by point A to point B is referred to as the edge. The amount of time for the voltage to change from 0 V to 1 V over the distance defined by point A to point B is the edge rate.

Typically, for a 2 GHz signal, signal edge rates range from 100 to 200 Pico seconds. The length of time of the transition directly affects the amount of jitter and the signal to noise ratio exhibited by the connector. An impedance mismatch at the connector typically causes jitter and noise throughout the system. The connectors and multi-layer circuit boards include several parts that may affect the impedance, such as, the trace segments on the circuit boards, vias through the circuit boards and contact pins engaging the vias. Vias in multi-layer printed circuit boards are capacitive. The capacitive nature of the vias typically causes the impedance of the vias to be lower than the desired signal impedance, that is, 50 Ohm or 100 Ohm. That is, typical connectors maintain an impedance lower than an ideal 50 Ohm or 100 Ohm (for differential connectors). Connector contacts have been positioned to optimize connector impedance, but have not been positioned to optimize connector footprint impedance.

Many board-to-board systems have been proposed that include multi-layer circuit boards and connectors there between that apply differential pairs of signals. The differential pairs include complimentary signals such that if one signal in a differential pair switches from 0 V to 1 V, the other signal in the differential pair switches from 1 V to 0 V. Differential pair connectors have been proposed that control impedance by using a calculated distance between signal pins of a differential pair. Impedance increases as capacitance decreases. Capacitance increases as the distance between a signal pin and ground or other signal pins decreases. Conversely, impedance increases with increased distance between signal pins. Therefore, signal pins of conventional systems are positioned a suitable distance from other signal pins in order to yield a suitable impedance. As the distance increases between two pins in a differential pair or otherwise, the pins are considered to be less "tightly coupled" to one another. Similarly, as the distance is decreased between pins in a differential pair or otherwise, the pins are considered to be more "tightly coupled" to one another. Loosening the coupling of signal pins of a differential pair increases the impedance exhibited at the pins while tightening the coupling between signal pins decreases the impedance.

Increasing the distance between signal pins of a differential pair also increases the interference, noise and jitter experienced from other signals in the multi-layer circuit board, the connector and pins. That is, as a signal pin of a differential pair is displaced further from its complimentary signal pin, each signal pin may become coupled to a signal pin of a different differential pair. As signal pins of separate different differential pairs become coupled to one another, the signal pins begin to exhibit cross-talk with each other. That is, loosening the coupling between complimentary signal pins may tighten the coupling between non-complimentary signal pins. Tightening the coupling between non-complimentary signal pins increases cross-talk between the pins. Consequently, interference, noise, and jitter within the multi-layer circuit board, connector and system increases. Therefore, increasing the distance between signal pins to increase the impedance within a particular differential pair of a multi-layer circuit board causes a higher degree of interference, noise and jitter within the multi-layer circuit board. Conversely, decreasing the distance between signal pins of a differential pair to decrease the amount of interference, noise and jitter within the multi-layer circuit board may produce a non-uniform or otherwise non-suitable impedance within the multi-layer circuit board.

Typically, signal pins and ground pins are arranged on circuit boards such that trace segments twist and turn around signal pins in order to connect to target signal pins. The signal pins are spaced to form routing channels there between the trace segments laid along non-linear routing channels. Heretofore, it has went unrecognized that non-linear routing channels degrade the signal performance. Instead, routing channels have been afforded less importance than via and pin position. The routing channels may be non-linear due to the presence of ground vias and pins or signal vias and pins that block a straight path to the target signal pin.

Typically, a pair of trace segments on a circuit layer connect to a differential pair of signal pins. That is, one trace segment connects to one signal pin of a differential pair while another trace segment connects to the complimentary signal pin. However, because of the non-linear tracing routes, the trace segments typically are not of equal length. Consequently, differential signals traveling through trace segments of different length may be out of phase with each other when arriving at an output pin or via. Differential signals that are out of phase, or skewed, may yield higher levels of interference within the connector and the system.

Thus, a need has existed for a multi-layer circuit board that exhibits improved signal characteristics in terms of impedance, interference, noise and jitter. That is, a need has existed for a multi-layer circuit board that maintains a suitable impedance at contact pins while simultaneously reducing the amount of interference, noise, and jitter within the multi-layer circuit board. Additionally, a need has existed for a multi-layer circuit board that exhibits less skew.

SUMMARY OF THE INVENTION

In accordance with an embodiment of the present invention, a multi-layer circuit board has been developed that simultaneously maintains a desired impedance while reducing interference within a multi-layer circuit board. The multi-layer circuit board includes at least one signal circuit layer, a plurality of signal contacts grouped in differential pairs and located on at least one signal circuit layer, and a plurality of ground contacts located on at least one ground circuit layer. The signal contacts are arranged in a pattern, or matrix, in which differential pairs of signal contacts are arranged in rows of the pattern, yet are staggered relative to differential pairs in adjacent rows. The signal contacts in each of the differential pairs are aligned in a first direction, for example, in rows. The differential pairs are staggered relative to other differential pairs oriented in a second direction, for example, columns. Because the differential pairs are staggered relative to one another, the number of circuit layers required to route all of the contacts is less than the number of rows of signal contacts in the pattern. The signal contacts may be vias, metal pins, metal pins retained within vias, and the like. The signal pins may be included within a connector and inserted into the vias.

In accordance with an embodiment of the present invention, each differential pair of the multi-layer circuit board is more tightly coupled to a ground contact than to any other signal contact. That is, a first signal contact of a differential pair is more tightly coupled to a ground contact than to a second signal contact of the differential pair.

In accordance with an embodiment of the present invention, the multi-layer circuit board includes a plurality of signal trace segments arranged in pairs. The signal trace segments are located on a circuit layer. On each circuit layer of the multi-layer circuit board, the signal trace segments of a pair are equal in length. The signal trace segments of a pair are mirror images of each other. That is, the position of each trace segment of a pair mirrors the position of the other, complimentary trace segment of the par. Further, in accordance with an embodiment of the present invention, a first signal trace segment of one pair electrically connects to a first signal contact of a differential pair while a second signal trace segment of the pair electrically connects to a second signal contact of the differential pair. The trace segments are routed adjacent one another along routing channels, or trace routes. The routing channels are linearly aligned in a different direction, or orientation, to that of the differential pairs. For example, if the differential pairs are aligned in rows, the routing channels may be oriented such that the routing channels are aligned perpendicular to the rows of differential pairs. That is, the signal pairs may be routed by in-column trace routes.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there is shown in the drawings, embodiments which are present preferred. It should be understood, however, that the present invention is not limited to the precise arrangements and instrumentality shown in the attached drawings.

DETAILED DESCRIPTION OF THE INVENTION

Figure 1:
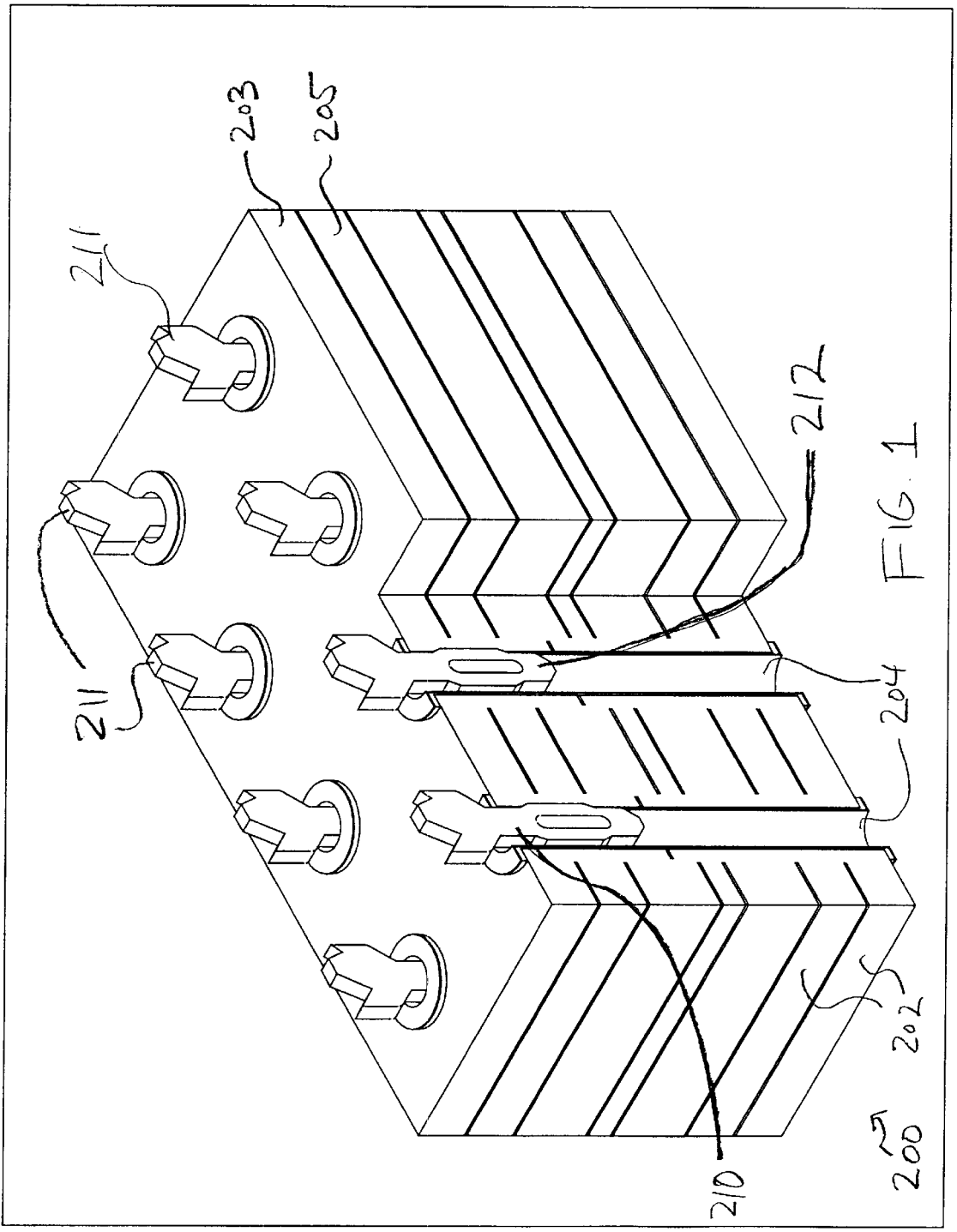
FIG. 1 illustrates a cross-sectional view of a portion of a multi-layer circuit board formed in accordance with an embodiment of the present invention.

FIG. 1 illustrates a cross-sectional view of a portion of a multi-layer circuit board 200 formed in accordance with an embodiment of the present invention. The multi-layer circuit board 200 includes a plurality of circuit layers 202. Preferably, the circuit layers 202 alternate between signal and ground circuit layers. For example, the top circuit layer 203 is a signal circuit layer, while the circuit layer 205 immediately below the top circuit layer 203 is a ground circuit layer. That is, the multi-layer circuit board 200 includes a series of conductive and insulated layers sandwiched together. The multi-layer circuit board 200 also includes a plurality of plated via through holes, that is, vias. The vias include via paths 204 formed within the multi-layer circuit board 200. The multi-layer circuit board 200 receives metal pins, or tails 210, that are retained by the via paths 204. The metal pins 210 include contact portions 211 that extend outwardly from the via paths 204 and retained portions 212 that fit within the via paths 204. A connector (not shown) may include the metal pins 210. That is, the metal pins 210 from a connector may be inserted into the vias.

In operation, a multi-layer circuit board 200 is attached to a connector housing of a controlled impedance connector. Another multi-layer circuit board 200 is attached to a separate housing of the same controlled impedance connector. By way of example only, a 50 Ohm impedance may be maintained throughout the controlled impedance connector if single ended vias and pins are used or a 100 Ohm impedance may be maintained if differential pairs 106 are used within the controlled impedance connector. A non-separable interface (not shown) is located between each multi-layer circuit board 200 and the controlled impedance connector. When the two housings of the connector are mated, a separable interface within the controlled impedance connector electrically connects one multi-layer circuit board 200 to the other multi-layer circuit board 200. That is, the two pieces of the controlled impedance connector may be separated, but each multi-layer circuit board 200 is permanently attached to one connector housing of the controlled impedance connector.

The metal pins 210 are retained by the via paths 204 of each multi-layer circuit board 200. The retained portion 212 of each metal pin 210 is formed to frictionally engage the inner walls of the via path 204. As each multi-layer circuit board 200 is interfaced with another multi-layer circuit board 200 through the controlled impedance connector, the metal pins 210 electrically connect with the via paths 204. Because both the via paths 204 and the contact portions 211 of the metal pins 210 are formed of conductive materials, such as metal, a conductive path is formed as the contact portions 211 are compressed into, or abut against, the via paths 204. Therefore, an electrical signal may pass from a contact portion 211 of each metal pin 210 into and through the via path 204.

A signal may pass through a conductive circuit layer 202 of the multi-layer circuit board 200 through trace segments (discussed below) onto a via path 204. The signal then travels along the via path 204. The signal then passes from the via path 204 onto the contact portion 211 of the metal pin 210. The signal then passes from the metal pin 210 located on one multi-layer circuit board 200 through the non-separable interface into the controlled impedance connector. The signal then travels on conductive paths within the controlled impedance connector onto a metal pin 210 located on another multi-layer circuit board 200. The signal may also pass from one conductive circuit layer 202 to another conductive circuit layer 202 located within the same multi-layer circuit board 200. The signals are generally carried through the board-to-board connector at very high data rates, such as a rate of 2 GHz or higher.

In one embodiment of the present invention, the contacts of the controlled impedance connector may contact surface conducting pads on a multi-layer circuit board 200 instead of the metal pins 210. The contacts of the controlled impedance connector may be soldered onto the conducting pads. Optionally, the contacts of the controlled impedance connector may be compressed into the conducting pads of the multi-layer circuit board 200 thereby forming an electrical path between the contacts of the controlled impedance connector and the contacting pads of the multi-layer circuit board 200. In another embodiment of the present invention, the multi-layer circuit board 200 may include the contacts while the controlled impedance connector may include the surface conducting pads.

Figure 4:
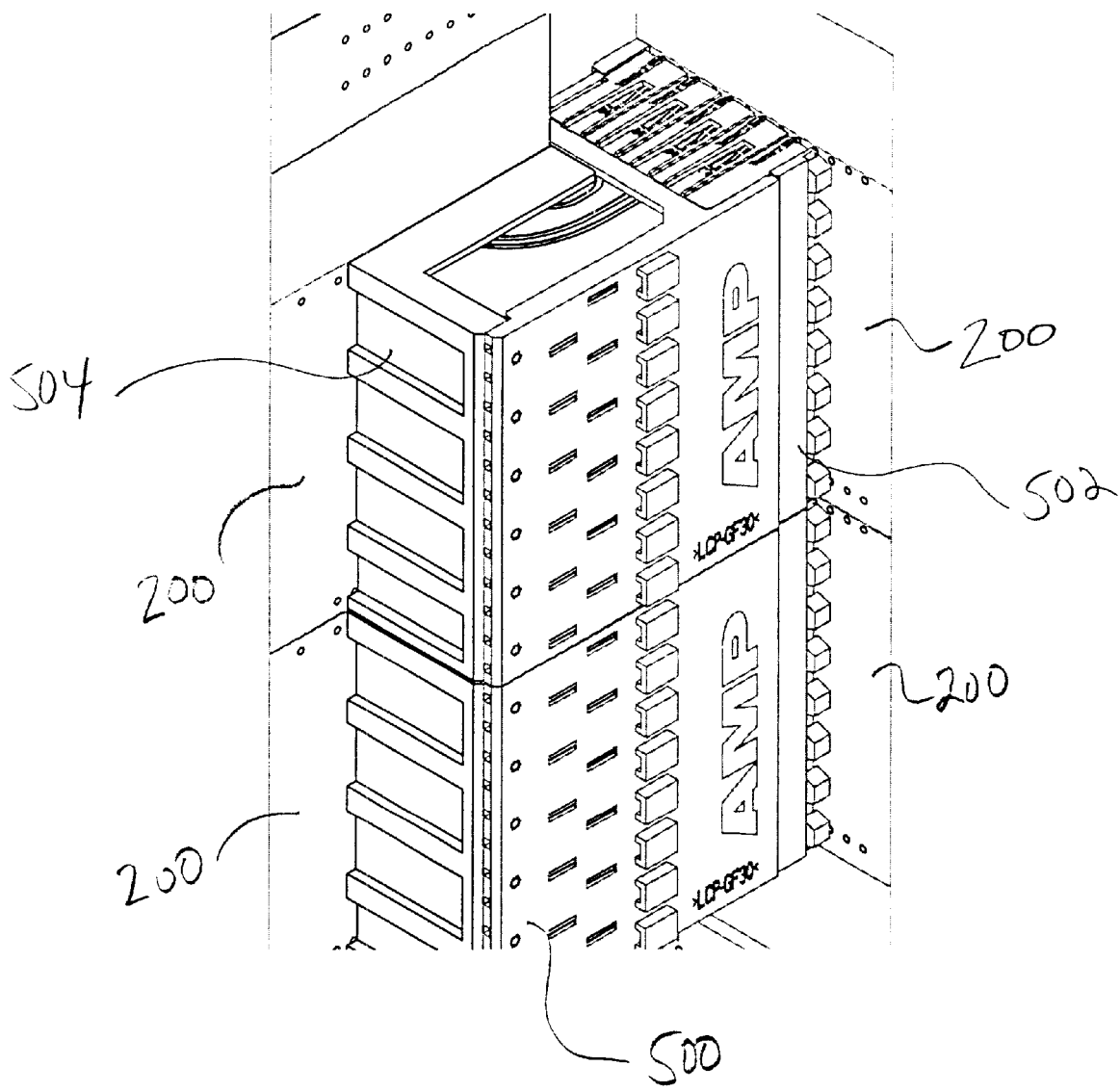
FIG. 4 illustrates a controlled impedance connector mounted to multi-layer circuit boards in accordance with an embodiment of the present invention.

FIG. 4 illustrates a controlled impedance connector 500 mounted to multi-layer circuit boards 200. The controlled impedance connector 500 includes a first housing 504 and second housing 502. The first and second housing 504, 502 connect to each other through a separable interface (not shown) located within the controlled impedance connector 500 such that the first housing 504 may be separated from the second housing 502. The first housing 504 and the second housing 502 electrically connect to the multi-layer circuit boards 200 through non-separable interfaces (not shown). For example, a multi-layer circuit board 200 may be soldered to, or permanently compressed into, contacts of the first housing 504 or the second housing 502.

Figure 2:
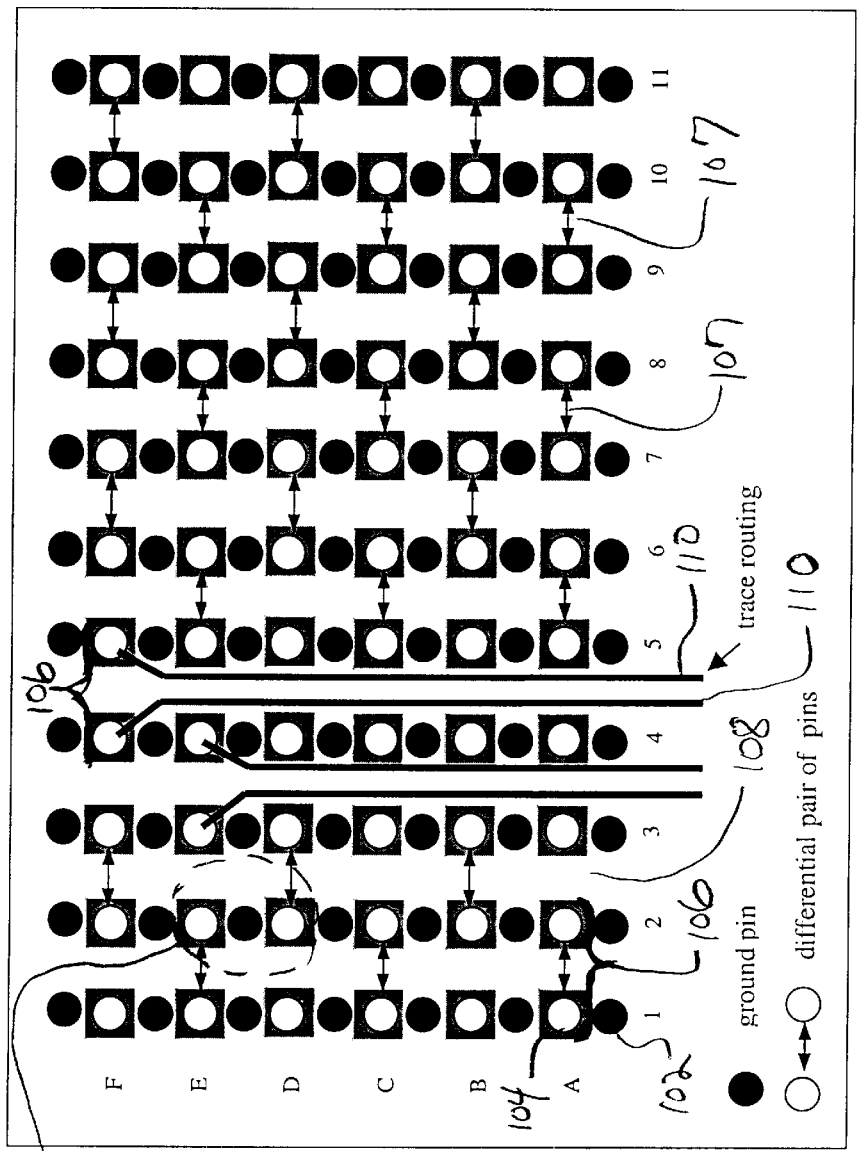
FIG. 2 illustrates a circuit layer pattern formed within a multi-layer circuit board in accordance with an embodiment of the present invention.

FIG. 2 illustrates a circuit layer pattern, or matrix, 100 formed within a multi-layer circuit board 200 in accordance with an embodiment of the present invention. The circuit layer pattern 100 includes a plurality of ground pins 102, a plurality of signal pins 104, routing channels 108, and trace segments 110 that electrically connect to the signal pins 104. The signal pins 104 are arranged in differential pairs 106. The signal pins 104 and ground pins 102 are connected to via paths 204.

The pattern, or footprint, 100 of each circuit layer 202 corresponds to the arrangement of contact pins located in the controlled impedance connector housing 504 or 502 in which each circuit layer 202 is housed. That is, the arrangement of signal pins 104 and ground pins 102 at the non-separable interface dictates the arrangement of vias needed to gain access to interior circuit layers 202. The pattern 100 is formed such that two rows of signal pins 104 are separated by a row of ground pins 102. For example, the signal pins 104 of row F and the signal pins of row E are separated by a row of ground pins 102. Additionally, the ground pins 102 and signal pins 104 are aligned in columns such that straight routing channels, or trace routes, 108 are formed between ground pins 102 and signal pins 104. For example, the routing channel 108 between columns #2 and #3 is straight and is not blocked by a ground pin 102 or a signal pin 104. Therefore, trace segments 110 positioned within the routing channels 108 may extend linearly, in-column, over the circuit layer 202 and parallel to one another. The straight, linear routing of trace segments 110 provides short routing of signal paths across the circuit layer pattern 100. As the length of pairs of trace segments 110 is shortened, differential signaling is enhanced by decreasing propagation delay and signal loss.

The straight routing of the routing channels 108 enhances differential signaling. Differential signaling requires at least one differential pair 106 of signal pins 104. Each signal pin 104 of a differential pair 106 is a complement of another signal pin 104 of the differential pair 106. That is, if one signal pin 104 switches from 0 V to 1 V, the other signal pin 104 of the differential pair 106 simultaneously switches from 1 V to 0 V. The signal pins 104 of each differential pair 106 are connected to corresponding trace segments 110. In the example of FIG. 2, the trace segments 110 of the differential pairs 106 are routed in-column while the differential pairs 106 of vias and pins are aligned in-row. That is, the trace segments 110 travel along in-column trace routes 108. In the embodiment of FIG. 2, the differential pairs 106 are all aligned parallel to one another and extending in an alignment or coupling pair direction denoted by arrows 107.

The trace segments 110 electrically connecting the differential pairs 106 travel through routing channels 108 that, in the embodiment of FIG. 2, are perpendicular to the direction of alignment 107, or orientation, of the differential pairs 106. Because the surface area of each trace 110 is small, a pair of trace segments 110 do not substantially couple to one another. Instead, the trace segments 110 couple to ground through ground circuit layers located above and below the trace segments 110. That is, the trace segments 110 in a pair are loosely coupled to each other and tightly coupled to the ground circuit layers. The electric and magnetic fields of each trace 110 occur mostly underneath each trace 110. The magnetic and electric fields of each trace 110 are coupled primarily between each trace 110 and the ground circuit layer 202 located underneath the signal plane on which the trace 110 is positioned.

The trace segments 110 may connect signal pins 104 to contacts at an edge of a circuit layer 202. Each trace segment 110 connects to one signal pin 104 of a differential pair 106 and an electrical contact (not shown) located the edge of the circuit layer 202. Two trace segments 110 travel together as a pair. Because the signal pins 104 of each differential pair 106 are complimentary, the trace segments 110 that connect to the signal pins 104 of the differential pair 106 are also complimentary. To control skew, each trace segment 110 on each circuit layer 202 is a mirror image of its corresponding, complimentary trace segment 110 on the same circuit layer 202. One trace segment 110 of a differential pair 106 is the same length as its complimentary trace segment 110. As shown in FIG. 2, one trace segment 110 of a differential pair 106 is a mirror image of its complimentary trace segment 110. That is, if one trace segment 110 connects to one signal pin 104 of a differential pair 106 at the lower left portion of the signal pin 104, the complimentary trace segment 110 will connect to the other signal pin 104 of the differential pair 106 at the lower right portion of the signal pin 104. The trace segments 110 are then linearly routed to the edge of the circuit layer 202 so that the trace segments 110 run parallel with the plane of the of the circuit layer 202 and are oriented perpendicular to the edge of the circuit layer 202. Because each trace segment 110 on each circuit layer 202 may be the same length as its corresponding, complimentary trace segment 110 on the same circuit layer 202, each trace segment 110 is in phase with its complimentary trace segment 110.

The ground pins 102 control cross-talk between signal pins 104 and vias 204. The ground pins 102 are positioned adjacent to signal pins 104 thereby forming columns of alternating, in-line signal pins 104 and ground pins 102. That is, each signal pin 104 is positioned between two ground pins 102. For example, column #3 of FIG. 2 illustrates the in-column, alternating fashion of ground pins 102 and signal pins 104. Therefore, because the ground pins 102 act as shields between two signal pins 104 positioned within a column, cross-talk between the in-column signal pins 104 is diminished. Ground pins 102, however, do not separate signal pins 104 aligned in rows as coupling is desired between signal pins 104 in a differential pair 106. That is, pin columns alternate between ground pins 102 and signal pins 104 while pin rows are all signal pins 104 or ground pins 102.

In one embodiment, each signal via path 204 and corresponding signal pin 104 is positioned closer to a ground pin 102 than another signal pin 104. Each signal pin 102 of a differential pair 106 is positioned closer to a ground pin 102 than to the complimentary signal pin 102 of the differential pair 106. Hence, each signal pin 104 of a differential pair 106 is loosely coupled to its complimentary signal pin 104 and tightly coupled to an adjacent ground pin 102. The tight coupling of each signal pin 104 to a ground pin 102 allows for continuity of coupling throughout the circuit layer 202. Because the signal pins 104 are tightly coupled to ground pins 102, cross-talk between signal pins 104 is decreased.

The loose coupling of the signal vias 204 and corresponding signal pins 104 controls the impedance within the multi-layer circuit board 200. Tight, or close coupling, of signal pins 104 maintains low impedance. For example, the impedance of the multi-layer circuit boards 200 and the controlled impedance connector 500 may be maintained at 50 Ohms if single ended signal pins 104 are utilized; and 100 Ohms if differential pairs 106 are utilized. Positioning the signal pins 104 further away from each other increases the impedance within the multi-layer circuit board 200. By moving the signal pins 104 of each differential pair 106 further apart from each other, the capacitive coupling between the signal pins 104 is reduced. The reduction in capacitance correspondingly increases the inductance in the system.

In accordance with at least one embodiment of the present invention, the performance of a multi-layer circuit board 200 may be optimized. Optimization is achieved by maintaining interference, such as cross-talk, jitter or noise below desired threshold levels within the multi-layer circuit board 200 while holding impedance exhibited at the signal pins 104 of a differential pair 106 within an acceptably small tolerance about a desired value. The signal pins 104 of each differential pair 106 are spaced from each other such that the impedance within the multi-layer circuit board 200 is approximately 100 Ohms. Even though the signal pins 104 are positioned further apart, cross-talk or noise between the signal pins 104 is held below a maximum threshold due to the tight coupling of the signal pins 104 to the ground pins 102. Therefore, the loose coupling of the signal pins 104 of each differential pair 106 maintains a suitable impedance within the multi-layer circuit board 200; while the simultaneous tight coupling of each signal pin 104 to ground pins 102 controls cross-talk and noise within the multi-layer circuit board 200.

Additionally, the differential pairs 106 are arranged such that each differential pair is staggered, or offset, from the nearest differential pairs 106 located in the other rows of the pattern 100. For example, the differential pairs 106 in row F of FIG. 2 are staggered relative to the differential pairs 106 in row E. The signal pin 104 located at row F, column #2 is loosely coupled to the signal pin at row F, column #3; while the signal pin 104 at row E, column #2 is loosely coupled to the signal pin 104 at row E, column #1. FIG. 2 illustrates three differential pairs 106 in each column. The staggering of differential pairs 106 reduces the total number of circuit layers 202 within the multi-layer circuit board 200 because signal pins 104 of adjacent rows in a single column (such as denoted in dashed circle 112) may be connected to trace segments 110 on a single circuit layer 202. The staggered arrangement of differential pairs 106 allows for a multi-layer circuit board 200 that may be routed using half the number of circuit layers 202 than if the differential pairs 106 were not staggered, or offset. For instance, if eight rows of differential pairs 106 were provided, no more than four circuit layers 202 would be needed.

As stated above, linear trace segments 110 connect to the signal pins 104 through the routing channels 108. However, only one pair of trace segments 110 may be positioned within one routing channel 108. The presence of more than one pair of trace segments 110 within one routing channel 108 would cause the trace segments 110 to route on top of each other thereby causing the trace segments 110 to short out. Therefore, if the signal pins 104 were not staggered, the number of rows of signal pins 104 would dictate the number of layers 202 of signal pins 104. For example, six rows of signal pins 104 would require six circuit layers 202 to sufficiently route the trace segments 110 to the signal pins 104. Staggering, or offsetting, the differential pairs 106 reduces the amount of required circuit layers 202. That is, because only three in-row differential pairs 106 exist within each plane of each routing channel 108, only three circuit layers 202 are used to route the trace segments to the signal pins 104.

Figure 3:
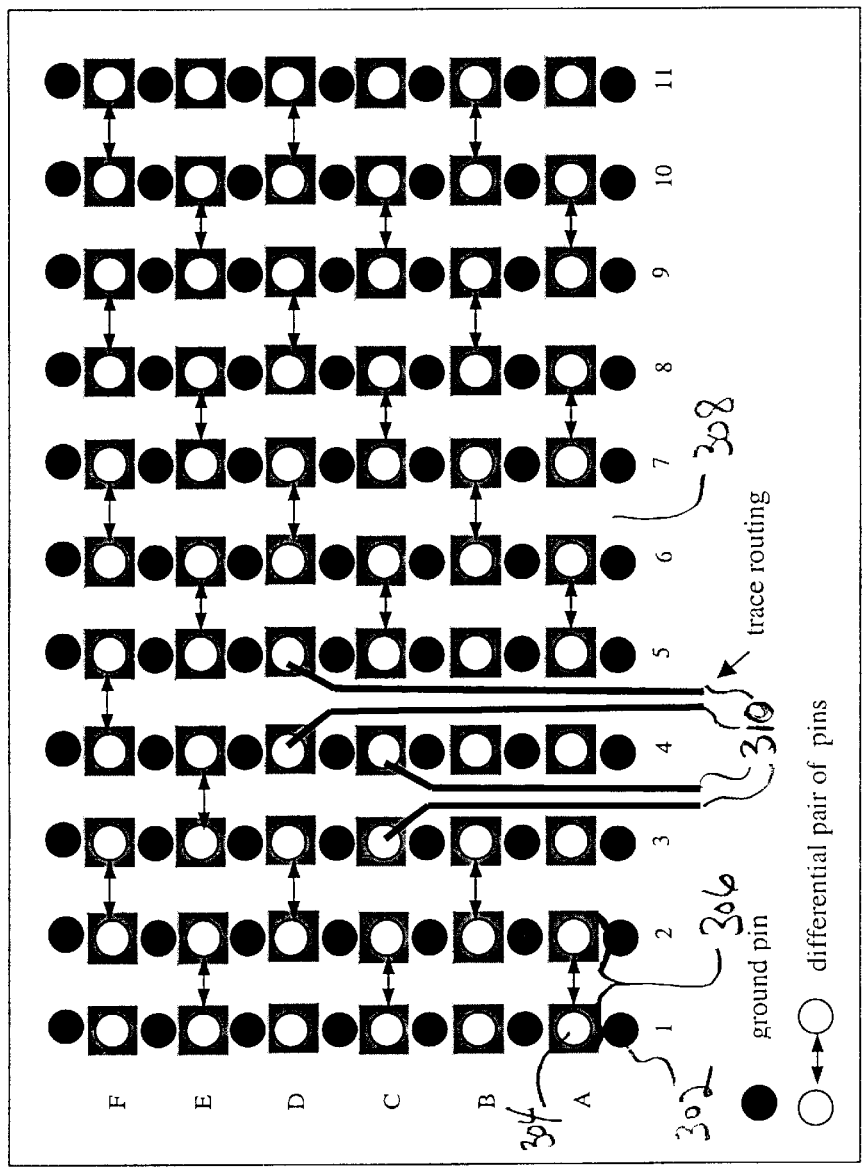
FIG. 3 illustrates a circuit layer pattern formed within a multi-layer circuit board in accordance with an embodiment of the present invention.

FIG. 3 illustrates a circuit layer pattern 300 formed within a multi-layer circuit board 200 in accordance with an embodiment of the present invention. The pattern includes differential pairs 306 of signal pins 304, ground pins 302, in-column routing channels 308 and trace segments 310.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications that incorporate those features coming within the scope of the invention.

What is claimed is:

1. A multi-layer circuit board comprising:
a plurality of signal contacts grouped in differential pairs and attached to at least one signal circuit layer;
a plurality of ground contacts attached to at least one ground circuit layer; and
said signal contacts being arranged in a pattern in which differential pairs of signal contacts are staggered in rows of said pattern.

2. The multi-layer circuit board of claim 1, wherein signal contacts in each of said differential pairs are aligned in a first direction; and
wherein said differential pairs are staggered relative to one another in a second direction.

3. The multi-layer circuit board of claim 1, wherein differential pairs in a first row of said pattern are staggered relative to differential pairs in a second row of said pattern.

4. The multi-layer circuit board of claim 1, wherein one signal contact of each differential pair is more tightly coupled to a ground contact than to any other signal contact.

5. The multi-layer circuit board of claim 1, wherein a first signal contact of a differential pair is more tightly coupled to a ground contact than to a second signal contact of said differential pair.

6. The multi-layer circuit board of claim 1, further including a plurality of signal trace segments arranged in pairs; each signal trace segment of a trace segment pair being positioned to mirror the position of its complimentary signal trace segment.

7. The multi-layer circuit board of claim 6, wherein a first signal trace segment of one pair electrically connects to a first signal contact of a differential pair; and wherein a second signal trace segment of said pair electrically connects to a second signal contact of said differential pair.

8. The multi-layer circuit board of claim 1, further including routing channels; wherein said differential pairs are aligned in a first direction; and wherein said routing channels are linearly aligned in a second direction.

9. The multi-layer circuit board of claim 1, wherein said signal and ground contacts are vias.

10. The multi-layer circuit board of claim 1, wherein the number of said signal circuit layers is less than the number of rows of said signal contacts of said pattern.

11. A multi-layer circuit board comprising:
at least one circuit layer;
a plurality of signal contacts grouped in differential pairs and arranged in rows on said circuit layer;
a plurality of ground contacts arranged in rows on a circuit layer; and
one signal contact of at least one differential pair being electrically and magnetically coupled more tightly to a ground contact than to any other signal contact.

12. The multi-layer circuit board of claim 11, wherein a first signal contact of a differential pair is more tightly coupled to a ground contact than to a second signal contact of said differential pair.

13. The multi-layer circuit board of claim 11, wherein said signal contacts are arranged in a matrix in which differential pairs of signal contacts are staggered in rows of said matrix.

14. The multi-layer circuit board of claim 11, wherein signal contacts in each of said differential pairs are aligned in a first direction; and
wherein said differential pairs are staggered relative to one another in a second direction.

15. The multi-layer circuit board of claim 11, wherein differential pairs in a first row are staggered relative to differential pairs in a second row.

16. The multi-layer circuit board of claim 11, further including a plurality of signal trace segments arranged in pairs; and
each signal trace segment of a trace segment pair being positioned to mirror the position of its complimentary signal trace segment.

17. The multi-layer circuit board of claim 16, wherein a first signal trace segment of one pair electrically connects to a first signal contact of a differential pair; and
wherein a second signal trace segment of said pair electrically connects to a second signal contact of said differential pair.

18. The multi-layer circuit board of claim 11, further including routing channels; wherein said differential pairs are aligned in a first direction; and
wherein said routing channels are linearly aligned in a second direction.

19. The multi-layer circuit board of claim 11, wherein said signal and ground contacts are plated via through holes.

20. The multi-layer circuit board of claim 11, wherein the number of signal circuit layers is less than the number of rows of said signal contacts.

21. A multi-layer circuit board comprising:
at least one signal circuit layer;
a plurality of signal contacts grouped in differential pairs and staggered in rows on said one signal circuit layer;
a plurality of ground contacts arranged in rows on a circuit layer; and
a plurality of signal trace segments arranged in pairs, each signal trace segment of a trace segment pair being connected to one signal contact of a differential pair;
each signal trace segment of a trace segment pair being positioned to mirror the position of its complimentary signal trace segment.

22. The multi-layer circuit board of claim 21, wherein a first signal trace of one pair electrically connects to a first signal contact of a differential pair; and wherein a second signal trace of said pair electrically connects to a second signal contact of said differential pair.

23. The multi-layer circuit board of claim 21, wherein said signal contacts are arranged in a pattern in which differential pairs of signal contacts are offset in rows of said matrix.

24. The multi-layer circuit board of claim 21, wherein signal contacts in each of said differential pairs are aligned in a first direction; and
wherein said differential pairs are offset relative to one another in a second direction.

25. The multi-layer circuit board of claim 21, wherein differential pairs in a first row are offset relative to differential pairs in a second row.

26. The multi-layer circuit board of claim 21, wherein one signal contact of each differential pair is more tightly coupled to a ground contact than to any other signal contact.

27. The multi-layer circuit board of claim 21, wherein a first signal contact of a differential pair is more tightly coupled to a ground contact than to a second signal contact of said differential pair.

28. The multi-layer circuit board of claim 21, further including routing channels; wherein said differential pairs are aligned in a first direction; and
wherein said routing channels are linearly aligned in a second direction.

29. The multi-layer circuit board of claim 21, wherein said signal and ground contacts are vias.

30. The multi-layer circuit board of claim 21, wherein the number of signal circuit layers is less than the number of rows of said signal contacts of said pattern.

31. A multi-layer circuit board comprising:

at least one signal circuit layer;

a plurality of signal contacts grouped in differential pairs and arranged in a number of rows on one said signal circuit layer;

a plurality of ground contacts arranged in rows on at least one ground circuit layer;

the number of signal circuit layers being less than said number of rows of said signal contacts of said pattern; and said signal contacts being arranged in a pattern in which differential pairs of signal contacts are staggered in rows of said pattern.

32. The multi-layer circuit board of claim 31, wherein signal contacts in each of said differential pairs are aligned in a first orientation; and wherein said differential pairs are staggered relative to one another in a second orientation.

33. The multi-layer circuit board of claim 31, wherein differential pairs in a first row are staggered relative to differential pairs in a second row.

34. The multi-layer circuit board of claim 31, wherein one signal contact of each differential pair is more tightly coupled to a ground contact than to any other signal contact.

35. The multi-layer circuit board of claim 31, wherein a first signal contact of a differential pair is more tightly coupled to a ground contact than to a second signal contact of said differential pair.

36. The multi-layer circuit board of claim 31, further including a plurality of signal trace segments arranged in pairs; each signal trace segment of a trace segment pair being positioned to mirror the position of its complimentary signal trace segment.

37. The multi-layer circuit board of claim 36, wherein a first signal trace of one pair electrically connects to a first signal contact of a differential pair; and wherein a second signal trace of said pair electrically connects to a second signal contact of said differential pair.

38. The multi-layer circuit board of claim 31, further including trace routes; wherein said differential pairs are aligned in a first direction; and wherein said trace routes are linearly aligned in a second direction.

39. The multi-layer circuit board of claim 31, wherein said signal and ground contacts are plated via through holes.

40. A multi-layer circuit board comprising:

at least one signal circuit layer;

a plurality of signal contacts grouped in differential pairs and located on one said signal circuit layer;

a plurality of ground contacts located on a ground circuit layer;

said signal contacts being arranged in a pattern in which differential pairs of signal contacts are staggered in a number rows of said pattern;

one signal contact of at least one differential pair being electrically and magnetically coupled more tightly to a ground contact than to any other signal contact;

a plurality of signal trace segments arranged in pairs, each signal trace segment of a trace segment pair being connected to one signal contact of a differential pair;

each signal trace segment of a trace segment pair being positioned to mirror the position of its complimentary signal trace segment; and the number of signal circuit layers being less than said number of rows of said signal contacts of said pattern.

* * * * *